(12) United States Patent
Kamei

(10) Patent No.: US 11,705,329 B2
(45) Date of Patent: Jul. 18, 2023

(54) SIC EPITAXIAL WAFER AND METHOD FOR MANUFACTURING SAME

(71) Applicant: SHOWA DENKO K.K., Tokyo (JP)

(72) Inventor: Koji Kamei, Chichibu (JP)

(73) Assignee: SHOWA DENKO K.K., Tokyo (JP)

( * ) Notice: Subject to any disclaimer, the term of this patent is extended or adjusted under 35 U.S.C. 154(b) by 434 days.

(21) Appl. No.: 16/620,088

(22) PCT Filed: May 14, 2018

(86) PCT No.: PCT/JP2018/018498
§ 371 (c)(1),
(2) Date: Dec. 6, 2019

(87) PCT Pub. No.: WO2019/003668
PCT Pub. Date: Jan. 3, 2019

(65) Prior Publication Data
US 2020/0203163 A1   Jun. 25, 2020

(30) Foreign Application Priority Data

Jun. 28, 2017 (JP) ................................. 2017-126744

(51) Int. Cl.
| | |
|---|---|
| H01L 21/02 | (2006.01) |
| C23C 16/32 | (2006.01) |
| C30B 25/20 | (2006.01) |
| C30B 29/36 | (2006.01) |
| H01L 29/04 | (2006.01) |

(Continued)

(52) U.S. Cl.
CPC ...... *H01L 21/02529* (2013.01); *C01B 32/956* (2017.08); *C23C 16/325* (2013.01); *C30B 25/20* (2013.01); *C30B 29/36* (2013.01); *H01L 21/02378* (2013.01); *H01L 21/02428* (2013.01); *H01L 21/02634* (2013.01);
(Continued)

(58) Field of Classification Search
None
See application file for complete search history.

(56) References Cited

U.S. PATENT DOCUMENTS

| 9,691,608 B2 * | 6/2017 | Tanaka | ............. H01L 21/02529 |
| 2016/0086798 A1 * | 3/2016 | Tanaka | ................ H01L 21/3065 257/77 |

FOREIGN PATENT DOCUMENTS

| JP | 2008-34776 A | 2/2008 |
| JP | 2011-219297 A | 11/2011 |

(Continued)

OTHER PUBLICATIONS

N. Zhang et al., "Nucleation mechanism of dislocation half-loop arrays in 4H-silicon carbide homoepitaxial layers", Applied Physics Letters, 2009, pp. 122108-1-122108-3, vol. 94, No.

(Continued)

*Primary Examiner* — Guinever S Gregorio
(74) *Attorney, Agent, or Firm* — Sughrue Mion, PLLC

(57) ABSTRACT

According to the present invention, there is provided a SiC epitaxial wafer including: a 4H-SiC single crystal substrate which has a surface with an off angle with respect to a c-plane as a main surface and a bevel part on a peripheral part; and a SiC epitaxial layer having a film thickness of 20 μm or more, which is formed on the 4H-SiC single crystal substrate, in which a density of an interface dislocation extending from an outer peripheral edge of the SiC epitaxial layer is 10 lines/cm or less.

9 Claims, 7 Drawing Sheets

(51) Int. Cl.
*H01L 29/16* (2006.01)
*H01L 29/34* (2006.01)
*C01B 32/956* (2017.01)
*C01B 32/90* (2017.01)

(52) U.S. Cl.
CPC .......... *H01L 29/04* (2013.01); *H01L 29/1608* (2013.01); *H01L 29/34* (2013.01); *C01B 32/90* (2017.08)

(56) References Cited

FOREIGN PATENT DOCUMENTS

| JP | 2011-219299 A | 11/2011 |
|---|---|---|
| JP | 2014-43369 A | 3/2014 |
| JP | 2014-231457 A | 12/2014 |
| JP | 2016-032002 A | 3/2016 |
| JP | 2016-119472 A | 6/2016 |
| JP | 2017-50446 A | 3/2017 |
| JP | 2017-108026 A | 6/2017 |
| JP | 2018-108916 A | 7/2018 |
| WO | 2008/120469 A1 | 10/2008 |

OTHER PUBLICATIONS

X. Zhang, "Glide and multiplication of basal plane dislocations during 4H-SiC homoepitaxy", Journal of Applied Physics, 2007, pp. 093520-1-093520-8, vol. 102, No. 093520.

International Search Report for PCT/JP2018/018498 dated, Jul. 24, 2018 (PCT/ISA/210).

Notice of Reasons for Rejection dated Jul. 6, 2021 in Japanese Patent Application No. 2017-126744.

* cited by examiner

SIC EPITAXIAL WAFER AND METHOD FOR MANUFACTURING SAME

TECHNICAL FIELD

The present invention relates to a SiC epitaxial wafer and a method for manufacturing the same.

Priority is claimed on Japanese Patent Application No. 2017-126744, filed on Jun. 28, 2017, the content of which is incorporated herein by reference.

BACKGROUND ART

Silicon carbide (SiC) has properties, which a dielectric breakdown electric field is one digit larger, a band gap is three times larger, and thermal conductivity is three times higher, than those of silicon (Si). Since silicon carbide has these characteristics, the silicon carbide is expected to be applied to a power device, a high frequency device, a high temperature operation device, and the like. Therefore, in recent years, a SiC epitaxial wafer is used for the above semiconductor devices.

To promote practical application of a SiC device, it is essential to establish high-quality crystal growth technology and high-quality epitaxial growth technology.

A SiC device is generally manufactured using a SiC epitaxial wafer in which a SiC epitaxial layer (film) that becomes an active region of the device by chemical vapor deposition (CVD) or the like is grown on a SiC single crystal substrate (simply referred to as a SiC substrate, in some cases) obtained by processing from a SiC bulk single crystal grown by sublimation recrystallization or the like.

More specifically, the SiC epitaxial wafer is generally obtained by growing 4H SiC epitaxial layer on a SiC single crystal substrate, in which a surface having an off angle from a (0001) plane to <11-20> direction is used as a growth surface, by step flow growth (lateral direction growth from an atomic step).

The SiC single crystal substrate generally has crystal defects called a threading screw dislocation (TSD), a threading edge dislocation (TED), or a basal plane dislocation (BPD), and device characteristics may deteriorate due to these crystal defects in some cases. These dislocations basically propagate from the SiC single crystal substrate to the SiC epitaxial film.

On the other hand, it is known that a dislocation called an interface dislocation occurs in the SiC epitaxial film. This interface dislocation is a kind of a basal plane dislocation, and extends in a direction perpendicular to a SiC substrate off-cut direction (in a case where an off-cut direction is <11-20>, <11-100> direction), near an interface between the SiC substrate and the SiC epitaxial film.

The interface dislocation is assumed to have been extended to relieve stress near the interface.

Furthermore, not only the threading edge dislocation propagated from the SiC single crystal substrate but also the threading edge dislocation row ("TED pairs 9" in FIG. 8) may be formed on the SiC epitaxial film. Specifically, in a case where two threading edge dislocations newly generated during epitaxial growth are paired, and the off-cut direction is <11-20>, the pairs of the two dislocations are continuous in a row in the <1-100> direction, and the threading edge dislocation row may be formed. As a result of generation of the threading edge dislocation row, the epitaxial film has a higher dislocation density than that of the SiC single crystal substrate, and may deteriorate crystallinity in epitaxial growth. The pairs of threading edge dislocations are connected in a half loop shape by the basal plane dislocation at the base thereof.

CITATION LIST

Patent Literature

[Patent Document 1] Japanese Unexamined Patent Application, First Publication No. 2008-34776

Non-Patent Literature

[Non-Patent Document 1] X. Zhang et al., Journal of Applied Physics 102, 093520 (2007)

DISCLOSURE OF INVENTION

Technical Problem

A relationship between the generation of the threading edge dislocation row and the interface dislocation and features of an X-ray topography image and a PL image, which were clarified based on observations by X-ray topography, photoluminescence (PL), and the like in Non-Patent Document 1, will be described with reference to FIG. 8.

FIG. 8 is a perspective view schematically showing a SiC epitaxial wafer in which a SiC epitaxial film is formed on a SiC single crystal substrate. For easy understanding, an A point, a B point, a C point, and an AB part and a BC part connecting these are shown.

In the X-ray topography image, an L-shaped dislocation is observed. The L-shaped dislocation is that the AB part (an interface dislocation 14) and the BC part (a basal plane dislocation 15) are observed in FIG. 8. The BC part crosses a SiC epitaxial film 5 while being placed on a (0001) basal plane 16 and terminates at the point C on a surface of the SiC epitaxial film 5. In the L-shaped dislocation, the BC part (the basal plane dislocation 15) moves to right direction during epitaxial growth. Accordingly, the AB part (the interface dislocation 14) extends to the right direction. In this manner, when the AB part (the interface dislocation 14) extends to a right side, the threading edge dislocation row (a "TED pair 9" in FIG. 8) is sequentially formed in a portion of C, and an array of the threading edge dislocation row can be arrayed (hereinafter, a structure in which the threading edge dislocation rows are arranged in a direction perpendicular to a step flow direction is referred to as a pair array (a pair array 11 in FIG. 8)). Thus, the generation of the threading edge dislocation row and the interface dislocation are closely related.

In the X-ray topography image, since an image of the threading edge dislocation row is in a position shallower from the surface as it goes to the right side, contrast becomes weaker.

In the X-ray topography image, all of the AB part (the interface dislocation), the BC part (the basal plane dislocation), and the threading edge dislocation row are often observed.

On the other hand, in the photoluminescence (PL) image, the array of the threading edge dislocation row is observed as an array of dots, and the BC part (the basal plane dislocation) is observed linearly. On the other hand, it is difficult to observe the AB part (the interface dislocation).

Therefore, when observing the array of dots and a linear pattern corresponding to the BC portion (the basal plane dislocation) in the PL image, the presence of the interface dislocation can be known.

The array of the threading edge dislocation rows extends perpendicular to the step flow direction, and one array of threading edge dislocation rows and one interface dislocation resulting from the generation of the array are present in parallel with each other. Accordingly, the presence of one interface dislocation extending perpendicular to the step flow direction can be confirmed by finding one array of dots. In addition, the BC part (the basal plane dislocation) extends parallel with the step flow direction, and one BC part (the basal plane dislocation) and one interface dislocation resulting from the occurrence of the BC part extend perpendicular to each other. Therefore, the presence of one interface dislocation extending perpendicular to the step flow direction can be confirmed by finding a linear pattern corresponding to the one BC portion (the basal plane dislocation).

The interface dislocation known in the related art is generated at a location on the SiC substrate, where there is a basal plane dislocation (BPD).

On the other hand, the present inventors found a new interface dislocation (hereinafter, referred to as "outer edge interface dislocation") that extends from an outer peripheral edge of a SiC substrate when a SiC epitaxial film grows on the SiC substrate. The present inventors found that the outer edge interface dislocation is generated by increasing a thickness of a SiC epitaxial film, through repeated studies. The interface dislocation of the related art starts from the location of the SiC substrate, where there is the BPD. However, the interface dislocation (the outer edge interface dislocation) found by the present inventors is different therefrom in a point that the interface dislocation starts from an outer peripheral edge of the SiC substrate. Since the interface dislocation lowers the reliability of a device as in the interface dislocation of the related art, it should be reduced.

The reason why the outer edge interface dislocation was not found until now is considered that this is because the SiC epitaxial film of which a thickness is thick to extent that the outer edge interface dislocation is generated is rarely used.

The present invention was made in view of the above circumstances, and an object thereof is to provide a SiC epitaxial wafer having a SiC epitaxial film having a film thickness of 20 μm or more and a low density of an outer edge interface dislocation, and a method for manufacturing the same.

Solution to Problem

The present invention provides means as follows, in order to solve the problems.

(1) According to a first aspect of the present invention, there is provided a SiC epitaxial wafer including: a 4H-SiC single crystal substrate which has a surface with an off angle with respect to a c-plane as a main surface and a bevel part on a peripheral part; and a SiC epitaxial layer having a film thickness of 20 μm or more, which is formed on the 4H-SiC single crystal substrate, in which a density of an interface dislocation extending from an outer peripheral edge of the SiC epitaxial layer is 10 lines/cm or less.

(2) According to a second aspect of the present invention, there is provided a SiC epitaxial wafer including: a 4H-SiC single crystal substrate which has a surface with an off angle with respect to a c-plane as a main surface and a bevel part on a peripheral part; and a SiC epitaxial layer having a film thickness of 20 μm or more, which is formed on the 4H-SiC single crystal substrate, in which the bevel part includes a slope part continuous from the main surface and an outer peripheral edge part, and the width of the slope part is 150 μm or more.

(3) In the SiC epitaxial wafer according to (1) or (2), the density of an interface dislocation in a range of central angles of 25° to 155° and 205° to 335° with a center line in a <11-20> direction may be 10 lines/cm or less.

(4) In the SiC epitaxial wafer according to any one of (1) and (3), the bevel part may include a slope part continuous from the main surface and an outer peripheral edge part, and a width of the slope part may be 150 μm or more.

(5) In the SiC epitaxial wafer according to (2) or (3), a density of an interface dislocation extending from an outer peripheral edge of the SiC epitaxial layer may be 10 lines/cm or less.

(6) According to a third aspect of the present invention, there is provided a method for manufacturing a SiC epitaxial wafer, in which a 4H-SiC single crystal substrate is used, wherein the 4H-SiC single crystal substrate has a bevel part in a peripheral part, in which the bevel part includes a slope part continuous from the main surface and an outer peripheral edge part, and a width of the slope part is 150 μm or more, is used.

(7) The method for manufacturing a SiC epitaxial wafer, according the third aspect of the present invention preferably includes: a step of preparing the H-SiC single crystal substrate; and a step of forming a SiC epitaxial film having a film thickness of 20 μm or more on the H-SiC single crystal substrate, in which a SiC epitaxial wafer obtained including the 4H-SiC single crystal substrate which has a bevel part on a peripheral part and has a surface with an off angle with respect to a c-plane as a main surface, and the SiC epitaxial film which is formed on the 4H-SiC single crystal substrate and has a film thickness of 20 μm or more, and a density of an interface dislocation extending from an outer peripheral edge of the SiC epitaxial layer is 10 lines/cm or less.

In the method for manufacturing a SiC epitaxial wafer according to (6) or (7), the step of forming a SiC epitaxial film having a film thickness of 20 μm or more preferably includes a sub-step of determining a thickness of an epitaxial film, satisfying Formula (1), using a width of the slope part of the substrate to be used, $$Y=20X-400 \tag{1}$$

(in Formula, Y represents a width (μm) of slope and X represents a thickness (μm) of an epitaxial film), and a sub-step of forming a SiC epitaxial film so that the thickness of the epitaxial film is set to be equal to or smaller than the determined thickness of the epitaxial film, satisfying Formula (1), which is obtained by the aforementioned formula.

Advantageous Effects of Invention

According to the SiC epitaxial wafer of the present invention, it is possible to provide a SiC epitaxial wafer having a SiC epitaxial film having a film thickness of 20 μm or more and a low density of an outer edge interface dislocation.

BEST MODE FOR CARRYING OUT THE INVENTION

Figure 1:
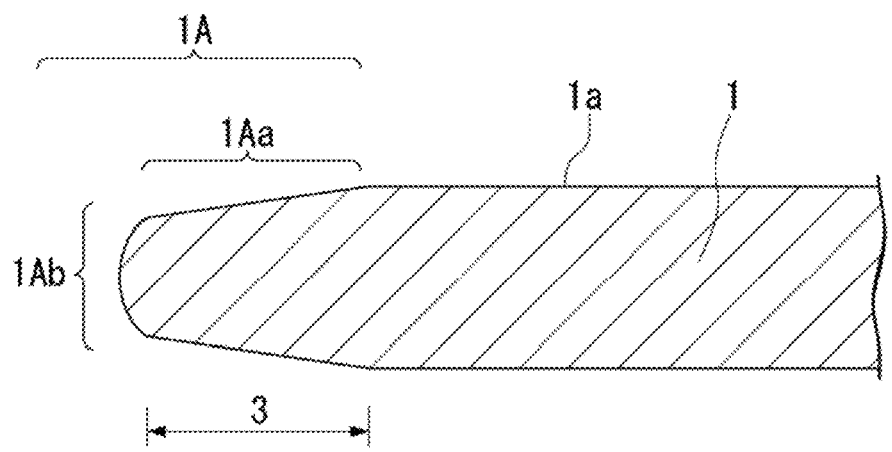
FIG. 1 is a schematic sectional view of the vicinity of a peripheral part of a SiC single crystal substrate.

Hereinafter, preferred examples of the present invention will be described. Specifically, a SiC epitaxial wafer and a method for manufacturing the same according to the preferred embodiments of the present invention will be described in detail, with reference to drawings. In the drawings used in the following description, to make features easier to understand, for the sake of convenience, a feature part may be enlarged and shown in some cases, and a dimensional ratio of each component may not be the same as that of an actual one. In addition, in the following description, a material, a dimension, and the like to be exemplified are examples. The present invention is not limited thereto, and can be performed with appropriate modifications within the range exhibiting an effect thereof. That is, the present invention is not limited to only the following examples, and addition, omission, substitution, or change in a position, the number, a shape, a material, a configuration, and the like can be made within the scope not departing from the gist of the present invention.

(SiC Epitaxial Wafer)

According to an embodiment of the present invention, there is provided a SiC epitaxial wafer including: a 4H-SiC single crystal substrate which has a surface with an off angle with respect to a c-plane as a main surface and a bevel part on a peripheral part; and a SiC epitaxial layer having a film thickness of 20 μm or more, which is formed on the 4H-SiC single crystal substrate, in which a density of an interface dislocation extending from an outer peripheral edge of the SiC epitaxial layer is 10 lines/cm or less.

The "interface dislocation extending from an outer peripheral edge" may be referred to as an "outer edge interface dislocation".

The c-plane represents a {0001} surface. The (0001) plane in the c-plane is described as a (0001) Si surface.

The density of the interface dislocation extending from the outer peripheral edge can be measured, for example, from a photoluminescence (PL) image. As the PL image, for example, a PL image obtained at a near-infrared (NIR) light receiving wavelength, by using a photoluminescence device (SICA88, manufactured by Lasertec Corporation) can be used.

The SiC epitaxial wafer of the present invention can include a SiC epitaxial layer having a film thickness of 20 μm or more and the density of the interface dislocation of the outer edge interface dislocation of zero lines/cm.

In addition, the SiC epitaxial wafer of the present invention can include a SiC epitaxial layer having a film thickness of 22 μm or more and the density of the interface dislocation of the outer edge interface dislocation of zero lines/cm.

In addition, the SiC epitaxial wafer of the present invention can include a SiC epitaxial layer having a film thickness of 24 μm or more and the density of the interface dislocation of the outer edge interface dislocation of zero lines/cm.

In addition, the SiC epitaxial wafer of the present invention can include a SiC epitaxial layer having a film thickness of 27 μm or more and the density of the interface dislocation of the outer edge interface dislocation of zero lines/cm.

In addition, the SiC epitaxial wafer of the present invention can include a SiC epitaxial layer having a film thickness of 29 μm or more and the density of the interface dislocation of the outer edge interface dislocation of zero lines/cm.

FIG. 1 is a schematic sectional view of the vicinity of a peripheral part of a SiC single crystal substrate.

A shape of the "bevel part" as used in the present specification will be described using FIG. 1. In the present specification, the "bevel part" is a portion of the peripheral part of the substrate that is chamfered to prevent a substrate from chipping or particles from being generated, and is a portion thinner than the thickness of the substrate.

A SiC single crystal substrate 1 has a main surface (flat part) 1a and a bevel part 1A including a slope part 1Aa and an outer peripheral edge part 1Ab in the periphery thereof. The bevel part 1A can also be understood as the following formula.

"Bevel part 1A"="Slope part 1Aa"+"Outer peripheral edge part 1Ab"

The "slope part" is a portion continuous from the flat part 1a of the SiC single crystal substrate, and is a portion having an inclined surface that is inclined toward an outer periphery with a predetermined angle of 60° or less (an angle relative to a plane including the main surface) with respect to the flat part. However, the inclined surface is not limited to a case of an inclined surface with only one angle, and may be inclined surface with a plurality of angles or a curved inclined surface having a curvature (smaller than a curvature of the "outer peripheral edge part"). In a case of the inclined surface having a curvature, an angle of the inclined surface refers to an angle of a tangential plane. An SiC single crystal substrate having an angle of 50° or less, 40° or less, 30° or less, or 20° or less as the angle of the inclined surface (an angle with respect to a plane including the main surface) that the "slope part" includes, may be used. Data shown in FIG. 5, which will be described later, was obtained in a case where a SiC single crystal substrate having an angle of 30° or less was used.

Further, the "outer peripheral edge part" is a portion disposed on the outermost side in a radial direction in the SiC single crystal substrate and a portion including a curved surface having a predetermined curvature. However, the curved surface is not limited to a curved surface having only one curvature, and may have a curved surface with a plurality of curvatures or may have a plane (for example, a vertical plane) on a portion that does not continue to the "slope part" among portions forming the "outer peripheral edge part". Based on an estimated mechanism of generation of the outer edge interface dislocation, which will be described later, if there is a structure having no "outer peripheral edge part" and vertically steep on an outer side from the "slope part", it seems that there is no location where nucleus that is a source of random growth is formed, which is good. However, in a case of this structure, a corner is likely to be chipped. Therefore, the corner is rounded off to prevent the corner from chipping, to have the "outer peripheral edge part" in general.

Figure 2:
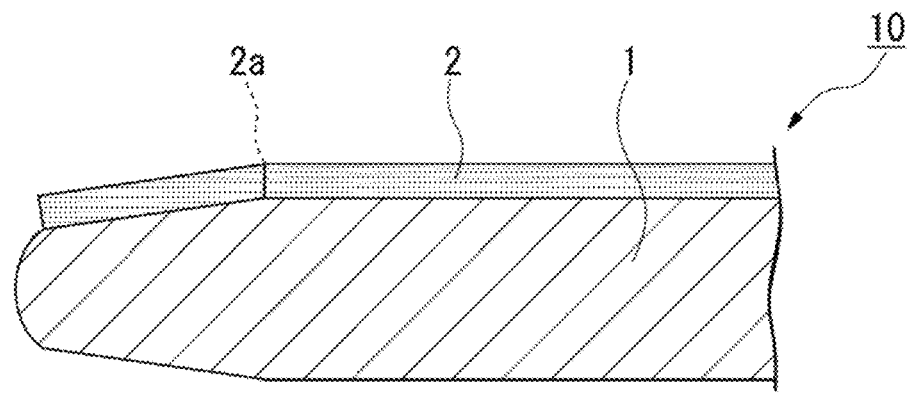
FIG. 2 is a schematic sectional view of the vicinity of a peripheral part of a SiC epitaxial wafer.

FIG. 2 is a schematic sectional view of the vicinity of a peripheral part of a SiC epitaxial wafer.

In a SiC epitaxial wafer 10, an outer peripheral edge 2a of a SiC epitaxial layer 2 refers to the outermost side in a radial direction, in the SiC epitaxial layer 2 formed on the main surface (the flat part) 1a of the SiC single crystal substrate 1.

Figure 3:
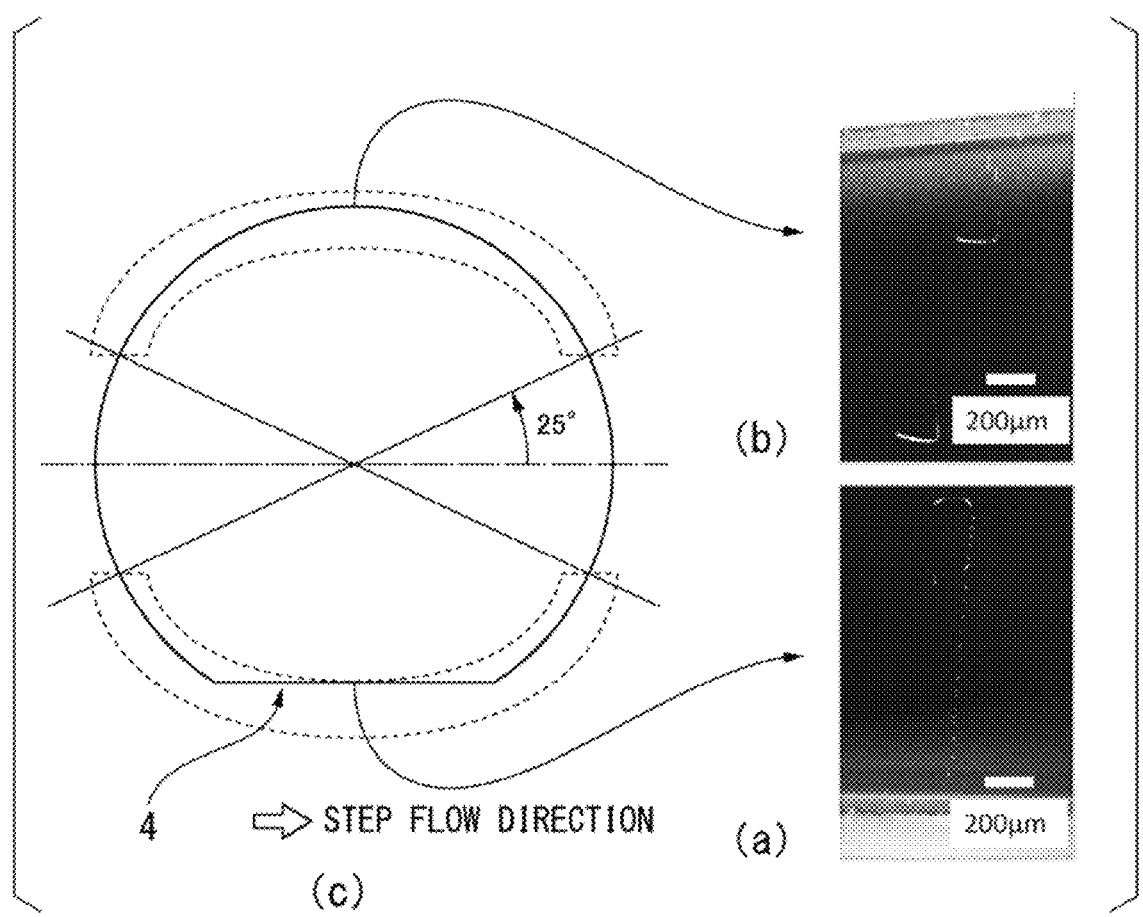
FIG. 3 is a schematic diagram showing a PL image obtained from a SiC epitaxial wafer and observation location, where (a) is a PL image at a position of an orientation flat, (b) is a PL image at a position on a side opposite the orientation flat, and (c) is a schematic diagram showing a relationship between the position of the orientation flat in the SiC epitaxial wafer and a step flow direction.

(a) and (b) in FIG. 3 show PL images obtained at different positions of the SiC epitaxial wafer. (c) of FIG. 3 is a schematic diagram showing a relationship between the position of an orientation flat in the SiC epitaxial wafer and a step flow direction.

(a) of FIG. 3 is a PL image at a position of the orientation flat, (b) of FIG. 3 is a PL image at a position on a side opposite the orientation flat.

In both (a) and (b) of FIG. 3, an array of dots and a linear pattern corresponding to a BC part (a basal plane dislocation) can be observed. In (a) of FIG. 3, since one array of dots and one linear pattern corresponding to the BC part (the basal plane dislocation) can be observed, it can be known that there is one outer edge interface dislocation. In (b) of FIG. 3, since two arrays of dots and two linear patterns corresponding to the BC part (the basal plane dislocation) can be observed, it can be known that there are two outer edge interface dislocations.

Based on results of PL observation by the inventors, the outer edge interface dislocation is the most in the vicinity of the orientation flat, and then many outer edge interface dislocations are in the position on the side opposite the orientation flat. On the other hand, at a position between the orientation flat and the side opposite the orientation flat, a direction perpendicular to the outer tangent, that is, an inclined direction of the slope part of the bevel part is close to parallel with the step flow direction. Therefore, there is almost no generation of the outer edge interface dislocation. The outer edge interface dislocation is often generated at 25° to 155° and 205° to 335° in terms of the central angle with respect to the center of the wafer.

According to another embodiment of the present invention, there is provided a SiC epitaxial wafer including: a 4H-SiC single crystal substrate which has a surface with an off angle with respect to a c-plane as a main surface and a bevel part on a peripheral part; and a SiC epitaxial layer having a film thickness of 20 μm or more, which is formed on the 4H-SiC single crystal substrate, in which the bevel part includes a slope part continuous from the main surface and an outer peripheral edge part, and the width of the slope part is 150 μm or more.

Here, the "width of the slope part" refers to the length in the radial direction when the slope part is viewed from a direction perpendicular to the main surface.

The estimated mechanism of generation of the outer edge interface dislocation will be described using FIG. 4.

Figure 4A:
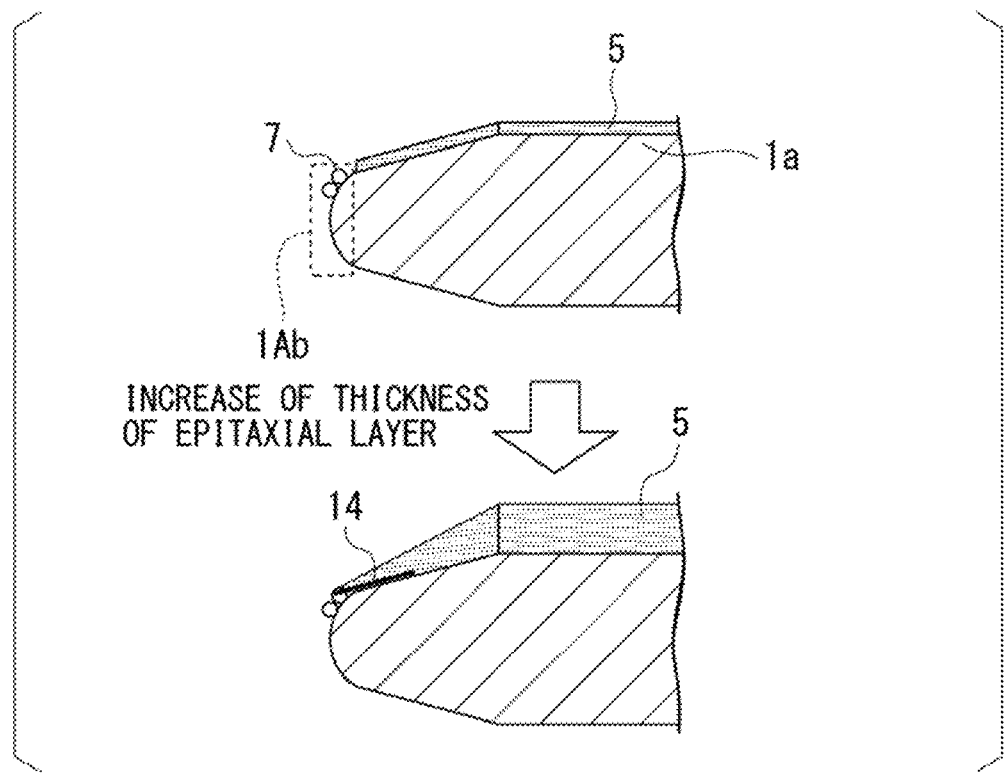
FIG. 4A is a schematic sectional view showing two stages of a SiC substrate and growth of a SiC epitaxial film grown thereon, in a case where a width of a slope part is large.
Figure 4B:
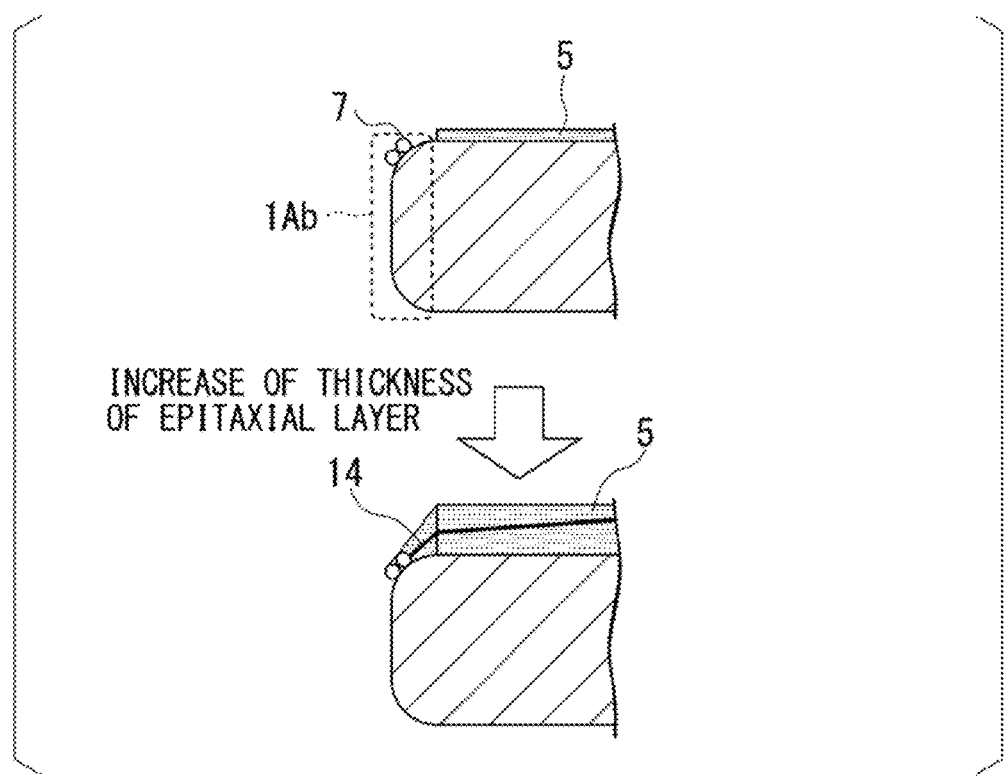
FIG. 4B is a schematic sectional view showing two stages of a SiC substrate and growth of a SiC epitaxial film grown thereon, in a case where a width of a slope part is small.

FIGS. 4A and 4B are schematic sectional views showing two stages of a SiC substrate and growth of a SiC epitaxial film grown thereon (an upper drawing shows an initial stage of growth and a lower drawing shows that growth is completed). FIG. 4A shows a case where the width of the slope part is large, and FIG. 4B shows a case where the width of the slope part is small.

In the initial stage of the epitaxial growth, it is considered that a nucleus 7 that is the source of random growth is formed in the outer peripheral edge part 1Ab. The reason is as follows.

In the flat part 1a of the main surface, the epitaxial film 5 is formed by step flow growth, and also in the slope part 1Aa, the step flow growth is maintained if the c-plane is dominant. Since it is common to practically use a SiC substrate with an off angle, it is considered that the step flow growth is maintained, and a probability of forming the nucleus 7 that is the source of random growth is low. On the other hand, in the outer peripheral edge part 1Ab, a surface other than the c-plane (an r-plane or an m-plane) becomes dominant. Accordingly, it can be considered that, in the outer peripheral edge part 1Ab, the step flow growth hardly occurs, and random growth occurs.

Based on the estimated mechanism of generation of the outer edge interface dislocation with reference to FIG. 4A, the reason why the outer edge interface dislocation has not been discovered until now can be considered as follows.

Even if a polymorphous epitaxial film extends from the nucleus 7 that is formed on the outer peripheral edge part 1Ab and is the source of random growth when epitaxial growth is performed, the outer edge interface dislocation found by the present inventors is not generated in a case where the interface dislocation does not reach the flat part until a film thickness of the epitaxial film 5 increases to be a desired film thickness. In the related art, it is considered that since the desired film thickness of the epitaxial film was thin, this situation occurs, that is, the interface dislocation did not reach the flat part.

On the other hand, in trend of demanding a thick epitaxial film with high-quality, the present inventors found the outer edge interface dislocation in the thick-film epitaxial film.

On the other hand, as shown in FIG. 4B, a substrate having a slope part with a small width (a distance from the outer peripheral edge part to the flat part is short), it is considered that, even in a case where the epitaxial film is thin, the outer edge interface dislocation is generated on the flat part.

Figure 5:
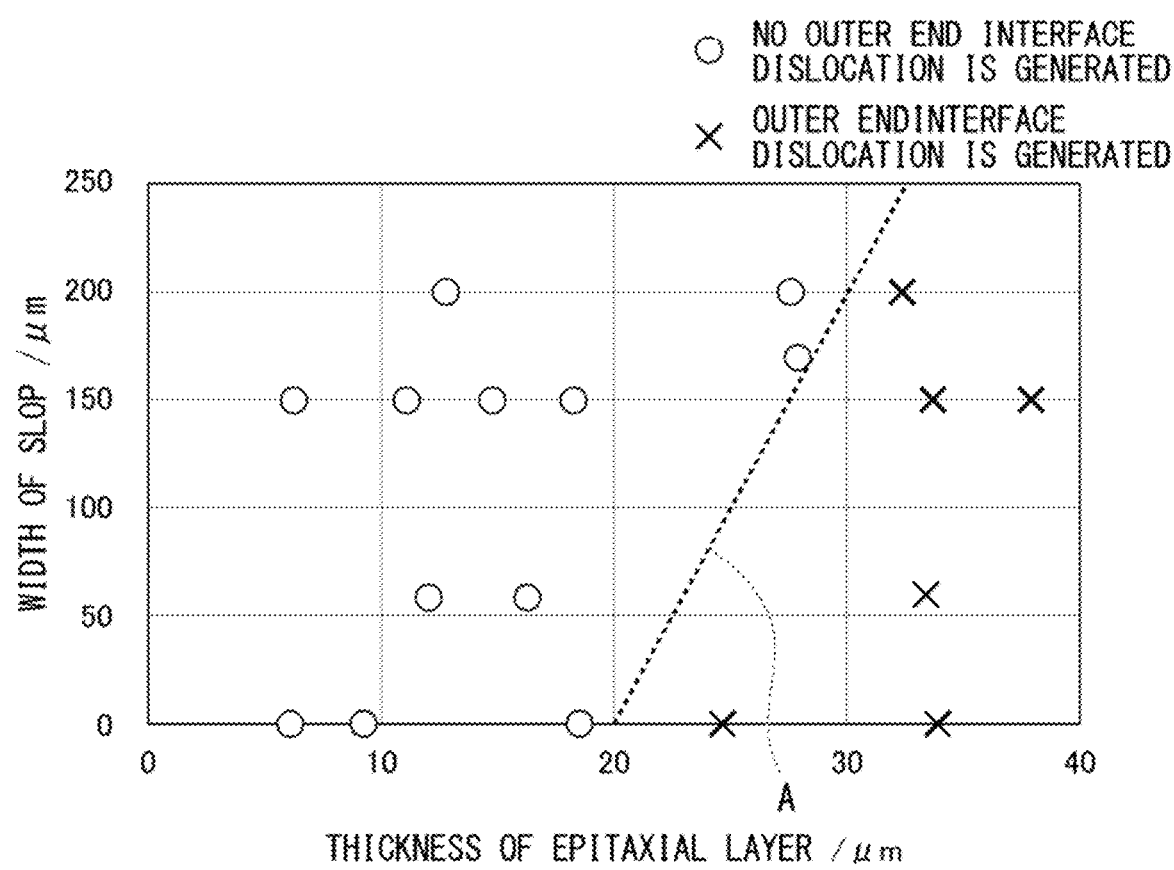
FIG. 5 is a graph showing results of examining a relationship between a film thickness of an epitaxial film and the presence or absence of generation of an outer edge interface dislocation.

FIG. 5 shows results of examining a relationship between a film thickness of an epitaxial film and the presence or absence of generation of the outer edge interface dislocation, when the slope part has a predetermined width.

In the graph shown in FIG. 5, the symbol "○" indicates that there is no outer edge interface dislocation, and the symbol "x" indicates that there is an outer edge interface dislocation. In the table, a dotted line indicates a boundary where a density of the outer edge interface dislocation is zero.

A sample from which data was acquired was obtained as follows. Using a 4 or 6 inch 4H-SiC single crystal substrate having an off angle of 4° with respect to the (0001) Si surface in a <11-20> direction, a known polishing step and a substrate surface cleaning (etching) step were performed.

Thereafter, a SiC epitaxial growth step (a growth temperature is 1600° C. and a C/Si ratio is 1.22) was performed using silane and propane as source gases while supplying hydrogen as a carrier gas. In this way, a SiC epitaxial layer with a predetermined film thickness was formed on a SiC single crystal substrate to obtain a SiC epitaxial wafer.

In FIG. 5, "0 μm of slope part" refers to slope in which a SiC single crystal substrate was only chamfered, and an angle of the chamfered portion exceeds 60°. Therefore, in accordance with the above definition of the slope part, this portion is not included in the slope part (accordingly, in this SiC single crystal substrate, the bevel part includes only the outer peripheral edge part).

In a case of using a SiC single crystal substrate with "0 μm of slope part", when the film thickness of the SiC epitaxial film was 6 μm, 9 μm, or 18 μm, there was no outer edge interface dislocation, but when the film thickness was 24 μm or 33 μm, the outer edge interface dislocation was generated. In each of 24 μm and 33 μm, the dislocation density of the outer edge interface dislocation was 50 lines/cm or higher.

In a case of using a SiC single crystal substrate with "60 μm of slope part" (an inclined angle of the slope part was 25°), when the film thickness of the SiC epitaxial film was 12 μm or 16 μm, there was no outer edge interface dislocation, but when the film thickness was 33 μm, the outer edge interface dislocation was generated. In the case of 33 μm, the dislocation density of the outer edge interface dislocation was 24 lines/cm.

In a case of using a SiC single crystal substrate with "150 μm of slope part" (an inclined angle of the slope part was 23°), when the film thickness of the SiC epitaxial film was 6 μm, 11 μm, 15 μm, or 18 μm, there was no outer edge interface dislocation, but when the film thickness was 33 μm or 38 μm, the outer edge interface dislocation was generated. In the cases of 33 μm and 38 μm, the dislocation density of the outer edge interface dislocation was 20 lines/cm and 41 lines/cm, respectively.

In a case of using a SiC single crystal substrate with "170 μm of slope part" (an inclined angle of the slope part was 23°), when the film thickness of the SiC epitaxial film was 28 μm, there was no outer edge interface dislocation.

Figure 6A:
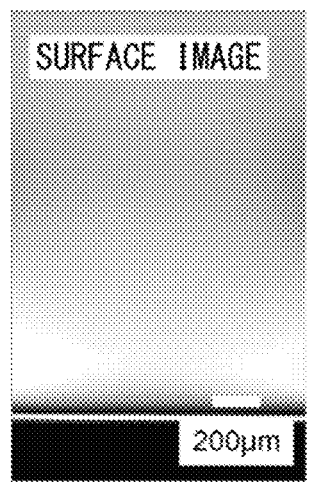
FIG. 6A is a confocal microscope image when an inclined part is 170 μm and a film thickness of a SiC epitaxial film is 28 μm, shown in FIG. 5.
Figure 6B:
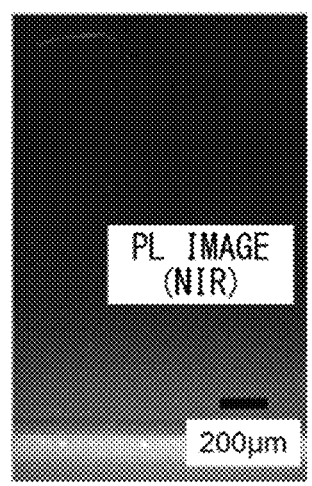
FIG. 6B is a PL image when an inclined part is 170 μm and a film thickness of a SiC epitaxial film is 28 μm, shown in FIG. 5.

For this sample, FIG. 6A shows a microscope image obtained by using a confocal microscope (SICA88, manufactured by Lasertec Corporation) which is a surface inspection device that uses a confocal differential interference optical system. In addition, FIG. 6B shows a PL image thereof.

In a case of using a SiC single crystal substrate with "200 μm of slope part" (an inclined angle of the slope part was 11°), when the film thickness of the SiC epitaxial film was 13 μm or 27.5 μm, there was no outer edge interface dislocation, but when the film thickness was 32 μm, the outer edge interface dislocation was generated. In the case of 32 μm, the dislocation density of the outer edge interface dislocation was 18 lines/cm.

In FIG. 5, when a horizontal axis (X axis) is the film thickness of the SiC epitaxial film and a vertical axis (Y axis) is the width of the inclined part, if an estimated boundary of presence or absence of generation of the outer edge interface dislocation is represented linearly, this can be expressed as $$Y = 20X - 400 \quad (1).$$

Based on Formula (1), when processing the width of the inclined part and selecting the film thickness of the SiC epitaxial film in order to satisfy Inequality Y>20X−400, a SiC epitaxial wafer which has no outer edge interface dislocation, or has a low density of the outer edge interface dislocation can be obtained.

The processing of the width of the inclined part can be performed using a known method. For example, contouring or the like can be used (see Patent Document 1).

Based on FIG. 5 and Formula (1), in a case of using a SiC single crystal substrate in which the width of the slope part is 50 μm, a SiC epitaxial wafer with no density of the outer edge interface dislocation can be obtained until the thickness of the SiC epitaxial film arrives at 22 μm. In addition, in a case of using a SiC single crystal substrate in which the width of the slope part is 100 μm a SiC epitaxial wafer with no density of the outer edge interface dislocation can be obtained until the thickness of the SiC epitaxial film arrives at 24 μm. In addition, in a case of using a SiC single crystal substrate in which the width of the slope part is 150 μm a SiC epitaxial wafer with no density of the outer edge interface dislocation can be obtained until the thickness of the SiC epitaxial film arrives at 27 μm. In addition, in a case of using a SiC single crystal substrate in which the width of the slope part is 200 μm a SiC epitaxial wafer with no density of the outer edge interface dislocation can be obtained until the thickness of the SiC epitaxial film arrives at 29 μm.

Figure 7A:
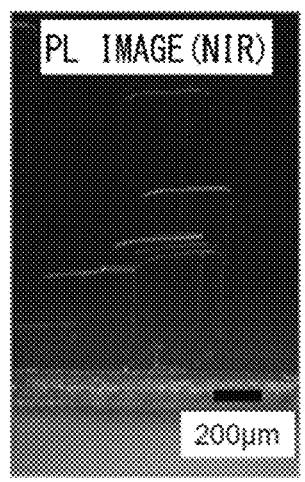
FIG. 7A is a PL image when an inclined part is 150 μm and a film thickness of a SiC epitaxial film is 33 μm, shown in FIG. 5.
Figure 7B:
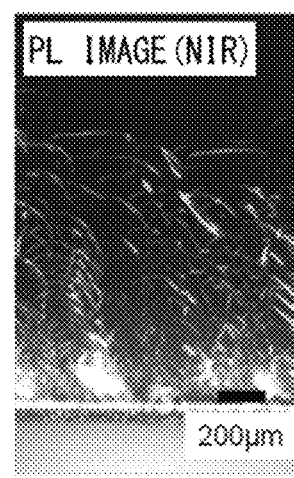
FIG. 7B is a PL image when an inclined part is 0 μm and a film thickness of a SiC epitaxial film is 33 μm, shown in FIG. 5.

FIGS. 7A and 7B show a PL image of a sample in a case where the inclined part is 150 μm and the film thickness of the SiC epitaxial film is 33 μm and a PL image of a sample in a case were the inclined part is 0 μm and the film thickness of the SiC epitaxial film is 33 μm, respectively, shown in FIG. 5.

Figure 8:
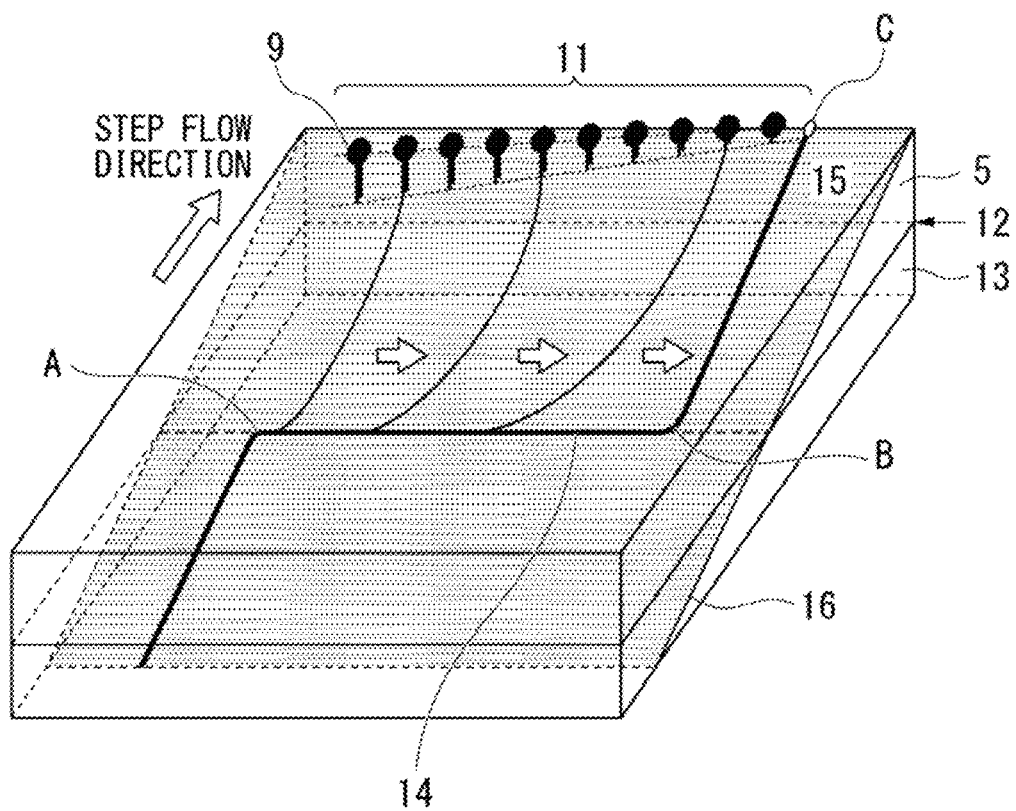
FIG. 8 is a perspective view schematically showing a SiC epitaxial wafer in which a SiC epitaxial film is formed on a SiC single crystal substrate, for illustrating a relationship between generation of a threading edge dislocation row and an interface dislocation.

In the PL image of FIG. 7A, the presence of 7 lines of interface dislocations can be confirmed from the number of L-shaped dislocations schematically shown in FIG. 8.

In the PL image of FIG. 7B, the presence of 50 or more lines of interface dislocations can be confirmed from the number of L-shaped dislocations schematically shown in FIG. 8.

The 4H-SiC single crystal substrate used for the SiC epitaxial wafer of the present invention has an off angle of, for example, 0.4° or more and 8° or less. Typical examples thereof include an off angle of 4°.

"Method for Manufacturing SiC Epitaxial Wafer"

According to still another embodiment of the present invention, there is provided a method for manufacturing a SiC epitaxial wafer, in which a 4H-SiC single crystal substrate having a bevel part in a peripheral part, in which the bevel part includes a slope part continuous from the main surface and an outer peripheral edge part and a width of the slope part is 150 μm or more, is used.

This method may include a step of preparing the H-SiC single crystal substrate and a step of forming a SiC epitaxial film having a film thickness of 20 μm or more on the H-SiC single crystal substrate. The step of forming the SiC epitaxial film having a film thickness of 20 μm or more may include a sub-step of determining a thickness of an epitaxial film, satisfying Formula (1), using a width of the slope part of the substrate to be used, and a sub-step of forming the SiC epitaxial film such that a thickness of a SiC epitaxial film to be manufactured is set to be equal to or smaller than the thickness of the epitaxial film, satisfying Formula (1), which is obtained by the aforementioned formula.

$$Y = 20X - 400 \quad (1)$$

(in Formula, Y represents a width (μm) of slope and X represents a thickness (μm) of an epitaxial film)

In the method for manufacturing a SiC epitaxial wafer according to the present embodiment, a known step can be used except for the setting step using a predetermined 4H-SiC single crystal substrate to use the aforementioned SiC wafer (SiC substrate). In addition, according to still another embodiment of the present invention, a method of manufacturing a SiC epitaxial wafer preferably a method including:

a step of selecting a thickness of an epitaxial film from a range of 20 μm or more;

a step of determining a width of slope satisfying Formula (1), using the selected thickness of the epitaxial film, $$Y=20X-400 \qquad (1)$$

(in Formula, Y represents a width (μm) of slope and X represents a thickness (μm) of an epitaxial film);

a step of preparing a 4H-SiC single crystal substrate having a bevel part on a peripheral part in which a width of slope thereof is equal to or more than a value of the determined width of the slope obtained by Formula (1); and a step of growing an epitaxial film with the determined thickness by using the prepared 4H-SiC single crystal substrate.

In the method for manufacturing a SiC epitaxial wafer of the present invention, the SiC epitaxial wafer of the present invention can be preferably manufactured.

INDUSTRIAL APPLICABILITY

The present invention provides a SiC epitaxial wafer having a SiC epitaxial film having a film thickness of 20 μm or more and a low density of an outer edge interface dislocation.

REFERENCE SIGNS LIST

1 SiC single crystal substrate
1a Main surface (Flat part)
1A Bevel part
1Aa Slope part
1Ab Outer peripheral edge part
2 SiC epitaxial layer
2a Outer peripheral edge
3 Width of slope part
4 Orientation flat
5 Epitaxial film
9 TED pair
10 SiC epitaxial wafer
11 Pair array
12 Interface
13 Substrate
14 Interface Transition
15 Basal plane dislocation
16 (0001) Basal plane
A Boundary at which outer edge interface dislocation density becomes zero $$Y=20X-400$$

The invention claimed is:
1. A SiC epitaxial wafer comprising:
a 4H-SiC single crystal substrate which has
a surface with an off angle with respect to a c-plane as a main surface and
a bevel part on a peripheral part; and
a SiC epitaxial film having a film thickness of 20 μm or more, which is formed on the 4H-SiC single crystal substrate,
wherein a density of an interface dislocation extending from an outer peripheral edge of the SiC epitaxial layer is 10 lines/cm or less.

2. The SiC epitaxial wafer according to claim 1,
wherein a density of the interface dislocation in a range of central angles of 25° to 155° and 205° to 335° with a center line in a <11-20> direction is 10 lines/cm or less.

3. The SiC epitaxial wafer according to claim 1,
wherein the bevel part includes a slope part continuous from the main surface and an outer peripheral edge part, and
a width of the slope part is 150 μm or more.

4. The SiC epitaxial wafer according to claim 1,
wherein the SiC epitaxial film is formed on the main surface and the bevel part of the substrate.

5. The SiC epitaxial wafer according to claim 1,
wherein the interface dislocation is a dislocation which starts from an outer peripheral edge of the substrate and extends in a direction, which is perpendicular to a substrate off-cut direction, near an interface between the substrate and the SiC epitaxial film.

6. The SiC epitaxial wafer according to claim 1,
wherein the density of the interface dislocation is measured from a photoluminescence (PL) image of the SiC epitaxial wafer.

7. A method for manufacturing the SiC epitaxial wafer according to claim 1,
wherein a 4H-SiC single crystal substrate is used,
wherein the 4H-SiC single crystal substrate has a bevel part in a peripheral part,
wherein the bevel part includes
a slope part continuous from the main surface and
an outer peripheral edge part, and
a width of the slope part is 150 μm or more.

8. The method for manufacturing a SiC epitaxial wafer, according to claim 7, comprising:
a step of preparing the H-SiC single crystal substrate; and
a step of forming a SiC epitaxial film having a film thickness of 20 μm or more on the H-SiC single crystal substrate,
wherein a SiC epitaxial wafer obtained includes
the 4H-SiC single crystal substrate which has the bevel part on a peripheral part and has a surface with an off angle with respect to a c-plane as a main surface; and
the SiC epitaxial film which is formed on the 4H-SiC single crystal substrate and has a film thickness of 20 μm or more, and
a density of an interface dislocation extending from an outer peripheral edge of the SiC epitaxial layer is 10 lines/cm or less.

9. The method for manufacturing a SiC epitaxial wafer according to claim 7,
wherein the step of forming the SiC epitaxial film having a film thickness of 20 μm or more includes
a sub-step of determining a thickness of an epitaxial film, satisfying Formula (1), using a width of the slope part of the substrate to be used, $$Y=20X-400 \qquad (1)$$

(in Formula, Y represents a width (μm) of slope and X represents a thickness (μm) of an epitaxial film), and
a sub-step of forming a SiC epitaxial film so that the thickness of the epitaxial film is set to be equal to or smaller than the determined thickness of the epitaxial film, satisfying Formula (1), which is obtained by the aforementioned formula.

* * * * *